United States Patent
Jefferson et al.

(10) Patent No.: US 9,442,158 B2
(45) Date of Patent: Sep. 13, 2016

(54) METHOD AND A SYSTEM FOR DETERMINING BETWEEN DEVICES A REFERENCE TIME FOR EXECUTION OF A TASK THEREON

(75) Inventors: Stanley Ted Jefferson, Palo Alto, CA (US); James Adam Cataldo, San Jose, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 2055 days.

(21) Appl. No.: 11/762,767

(22) Filed: Jun. 13, 2007

(65) Prior Publication Data

US 2008/0309460 A1 Dec. 18, 2008

(51) Int. Cl.
*G01R 31/28* (2006.01)
*G01R 35/00* (2006.01)

(52) U.S. Cl.
CPC ......... *G01R 31/2839* (2013.01); *G01R 35/005* (2013.01)

(58) Field of Classification Search
USPC ............... 702/79, 89, 122–125; 700/306; 713/400, 401; 370/503, 507, 508
See application file for complete search history.

(56) References Cited

U.S. PATENT DOCUMENTS

| | | | |
|---|---|---|---|
| 4,945,486 A * | 7/1990 | Nitschke et al. | 701/114 |
| 6,983,228 B2 | 1/2006 | Kodosky et al. | |
| 7,099,792 B2 * | 8/2006 | Giral et al. | 702/123 |
| 2004/0064750 A1 * | 4/2004 | Conway | 713/401 |
| 2006/0053408 A1 | 3/2006 | Kornerup et al. | |
| 2006/0053409 A1 | 3/2006 | Kornerup et al. | |
| 2008/0077350 A1 * | 3/2008 | Reichert | 702/125 |

* cited by examiner

*Primary Examiner* — Manuel L Barbee

(57) ABSTRACT

A method is disclosed for determining, between an initiating device and at least one responding device, a reference time for the execution of at least one task on one of the devices. The method includes the initiating device prompting at least one responding device to provide a respective desired reference time. The method further includes at least one responding device providing a respective desired reference time, in response to the prompting. An actual reference time is determined based on any desired reference times provided. In one embodiment, the actual reference time is the latest of all desired reference times. A system including the initiating device and a responding device is also disclosed.

18 Claims, 5 Drawing Sheets

METHOD AND A SYSTEM FOR DETERMINING BETWEEN DEVICES A REFERENCE TIME FOR EXECUTION OF A TASK THEREON

BACKGROUND

During testing of a device-under-test (DUT) using a number of test instruments, it is sometimes desirable to carry out tasks on the various instruments that are synchronized in time. Examples of such tasks are those required for measuring the root-mean-square (RMS) power of a DUT in response to a stimulus signal. To make such a measurement in the prior art, a test system 2 (FIG. 1) including a function generator 4 and two digital multimeters (DMMs) 6, 8 connected to a controller 10 is required. The controller 10 controls and coordinates the operation of the function generator 4 and the DMMs 6, 8. To make a measurement, the controller 10 first configures the function generator 4, for example to select an output waveform type, and to set the amplitude and frequency of the output signal. The controller 10 next instructs the function generator 4 to output the selected signal for use as a stimulus signal to the DUT 12. The controller 10 then polls the function generator 4 to find out when the output signal of the function generator 4 is stable. The time taken for the output signal to stabilize depends on the frequency of the signal. Once the function generator 4 informs the controller 10 that the output signal is stable, the controller 10 will then instruct a first 8 of the two DMMs to measure the RMS voltage. After the controller has obtained the RMS voltage reading from the first DMM 8, the controller 10 instructs the second DMM 6 to measure the RMS current. When the controller 10 receives the current reading, it then computes the RMS power. One disadvantage of such a solution is that the voltage and the current measurements are not carried out at exactly the same instant in time but a short interval apart. Such a time lag in making the current measurement may result in inaccuracies in the power measurement. Another disadvantage is that time is wasted in the communication between the controller 10 and each of the function generator 4 and the DMMs 6, 8 during the measurement.

With the introduction of LAN extensions for instrumentation (LXI), test and measurement instruments are able to communicate directly with one another via multicast messages to perform time-based measurements. All the instruments will be able to send time-stamped data to one another. And with the IEEE 1588 time synchronization protocol, any discrepancies in the clocks in the different instruments can be reduced to less than 50 ns. With such LXI instruments, the above described power measurement on the DUT 12 may be carried out by the DMMs 6, 8 at a predetermined time without the need for the controller. However, this predetermined time is dependent on the time it takes the output signal of the function generator 4 to stabilize. Since the time taken for the output signal to stabilize is dependent on the frequency of the output signal, the DMMs 6, 8 are programmed with the longest time taken for any output signal to stabilize. This solution for making measurements at predetermined fixed times is thus not optimal for use in a production line where throughput is of utmost importance and where the arrival of a DUT at the test system is sometimes unpredictable.

BRIEF DESCRIPTION OF DRAWINGS

The invention will be better understood with reference to the drawings, in which.

DETAILED DESCRIPTION OF THE EMBODIMENTS

Figure 1:
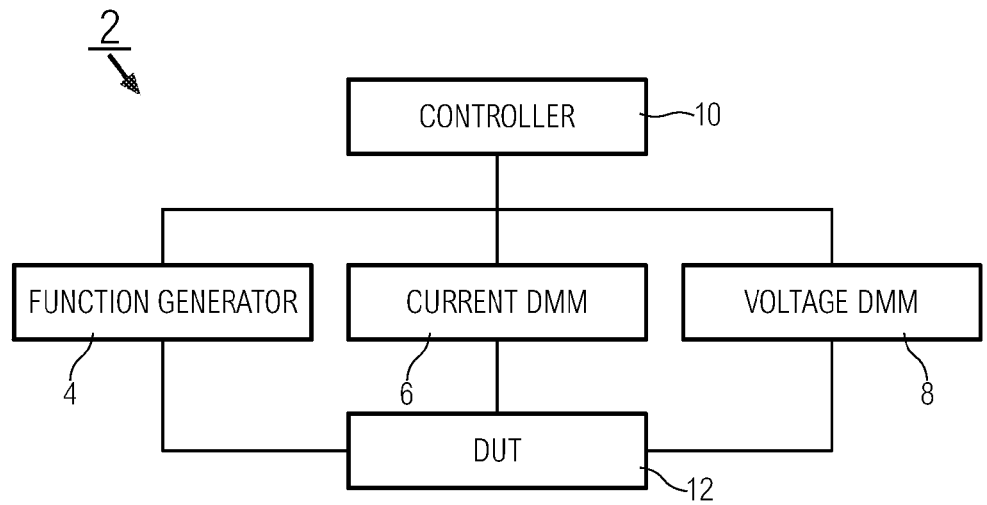
FIG. 1 is a block diagram of a prior art test system for measuring the RMS power at a device under test (DUT) in response to a stimulus signal.

As shown in the drawings for purposes of illustration, the invention is embodied in a novel method for determining, between an initiating device and at least one responding device, a reference time for the execution of at least one task thereon. This method allows the devices to coordinate the execution of one or more tasks on at least one of the devices so that the one or more tasks are executed according to a predetermined schedule. The method includes the initiating device prompting the at least one responding device to provide a desired reference time. The method further includes at least one responding device providing a respective desired reference time in response to the prompting. An actual reference time by which one or more of the devices can base the execution of the one or more tasks on is determined based on any desired reference times that are available. Using the method, the devices are able to agree on a reference time by which at least one of the devices could base the execution of a task thereon. That is, the scheduling of the task is based on this actual reference time that is determined.

Figure 2:
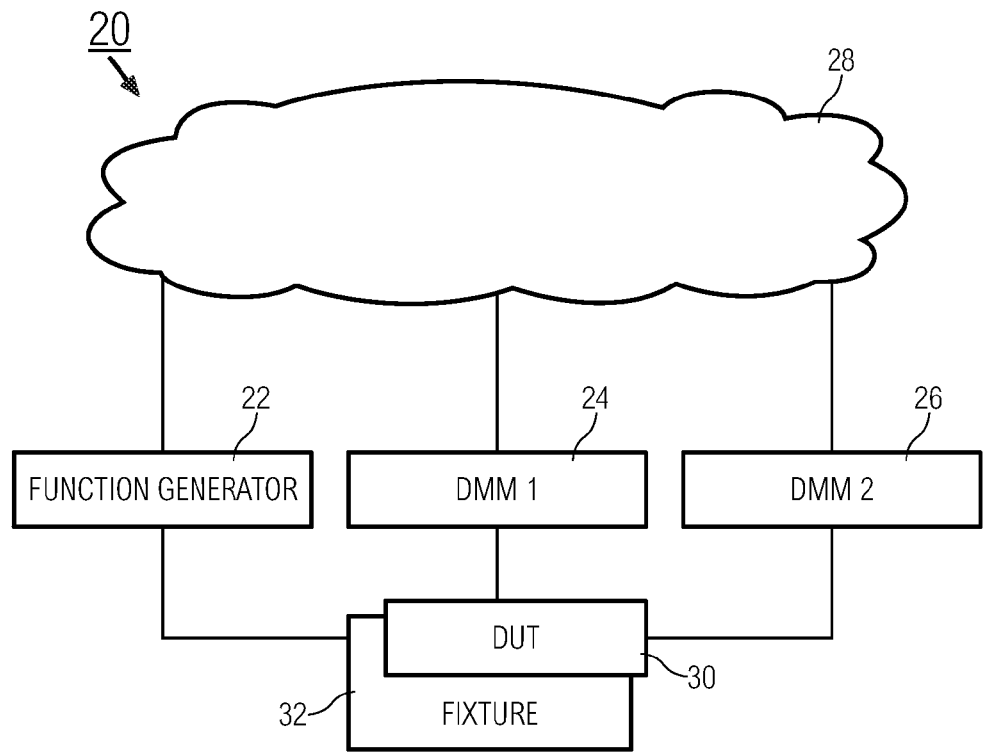
FIG. 2 is a block diagram of a test system including several test instruments according to an embodiment of the invention.

FIG. 2 shows a block diagram of a system 20 that embodies the above described method. The system 20 includes a function generator 22, a first digital multimeter (DMM1) 24, and a second digital multimeter (DMM2) 26 connected to an Ethernet 28. In this test system 20, the function generator 22 functions as the initiating device and the DMMs 24, 26 function as responding devices according to the above described method. The system 20 should not be construed to include only such devices 22, 24, 26; the system 20 may include other devices that are common in a testing environment such as power supplies, oscilloscopes, spectrum analyzers, network analyzers, signal generators, signal analyzers, switch matrices, etc. It should also be noted that the devices 22, 24, 26 may be connected to other types of wired or wireless networks. The method may also be implemented in systems that are non-testing related, such as but not limited to, networked control systems, industrial automation systems, computer networks, and telecommunication systems. Consequently, the devices may include robots, controllers, servers, routers, switches, etc. The system may also be implemented in a single piece of equipment. In such a case, the devices may be separate cards that are connected to a common bus in the equipment, or the devices may be separate hardware or software modules.

In the system 20 in FIG. 2, the function generator 22 and the DMMs 24, 26 are LXI compliant devices. More specifically, the function generator 22 is an LXI Class A device which includes a standardized LAN interface and a trigger interface (both not shown). The two DMMs 24, 26 are LXI Class B devices, each of which includes a standardized LAN interface. These devices 22, 24, 26 are thus capable of inter-device communication. The function generator 22 and the DMMs 24, 26 support the Precision Time Protocol (PTP) defined in the IEEE 1588-2002 standard. Supporting the IEEE 1588 standard enables these devices 22, 24, 26 to have a sense of time and thus allows the precise synchronization of the devices. Accuracy of time within the nanosecond range can be achieved by using hardware generated timestamps in the devices 22, 24, 26.

During use for measuring the root-mean-square (RMS) power consumed by a DUT 30 in response to a given stimulus signal, the function generator 22 and the DMMs 24, 26 are connected via a test fixture 32 to the DUT 30. When the DUT 30 is connected to the devices 22, 24, 26, the test fixture 32 triggers the function generator 22 to apply the stimulus signal to the DUT 30. Alternatively, the function generator 22 may be connected to a personal computer (PC) (not shown) and triggered to start the measurement by an operator entering an appropriate command on the PC after connecting the DUT 30 to the test fixture 32. When the stimulus signal stabilizes after some time, the DMMs 24, 26 make their respective voltage and current measurements. In one embodiment, these measurements are taken at precisely the same time to avoid any discrepancy. The sequence 40 (FIG. 4) of steps for coordinating the respective tasks in the function generator 22 and the DMMs 24, 26 to carry out the RMS power measurement will be described in more detail shortly.

Figure 3:
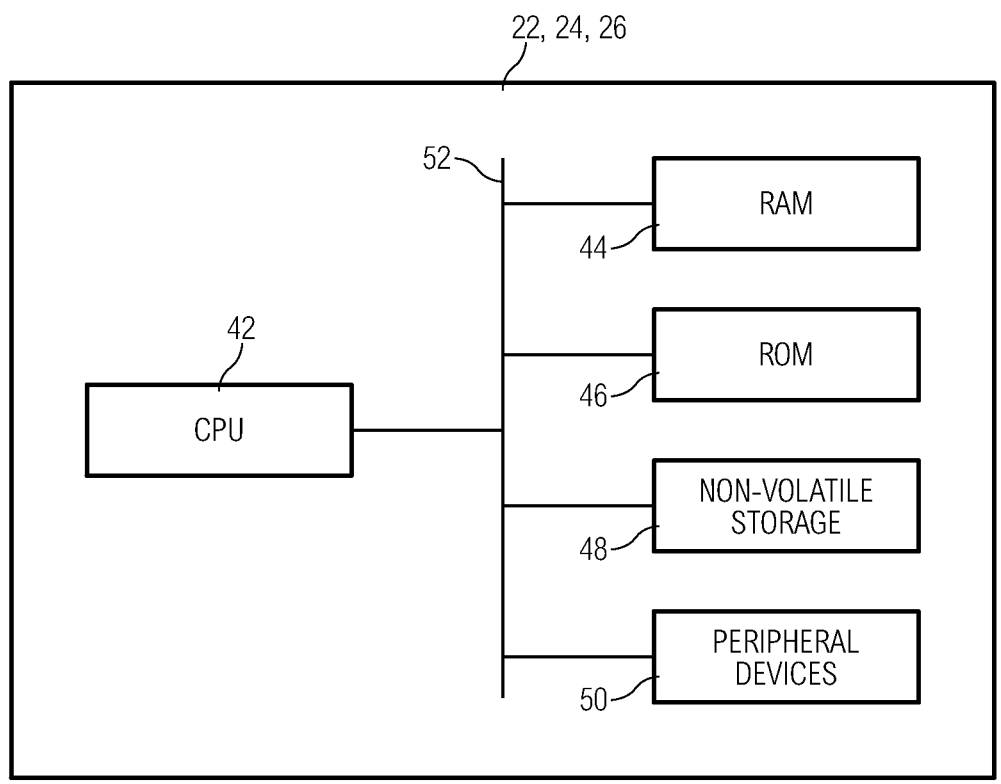
FIG. 3 is a generic block diagram of a test instrument in FIG. 2.

With reference to FIG. 3, each of the devices 22, 24, 26 generally includes a central processing unit (CPU) 42 that is coupled to a random access memory (RAM) 44, a read only memory (ROM) 46, a non-volatile storage unit 48 and other peripheral devices 50 via an internal bus 52. The bus 52 carries data signals, control signals and power to the various components of each device 22, 24, 26. The non-volatile storage unit 48 may be a floppy disk, a compact disc (CD), a chip card or a hard disk. The other peripheral devices 50 may include a display, a keyboard, a mouse, and other device-specific components (all not shown). The display may be a video display, LCD display, touch-sensitive display, or other display types. The ROM 46 or the non-volatile storage unit 48 may serve as a program storage device for storing a program of instructions that is executable by the CPU 42 for implementing the respective portion of the sequence 40. The program may be implemented in any high level or low level programming languages.

The first sequence 40 of steps implemented in the function generator 22 and the DMMs 24, 26 will be described next with the aid of FIG. 4. The sequence 40 involves the group of devices 22, 24, 26 coordinating the execution of tasks on the DMMs 24, 26 among themselves in a reference time negotiation session. The sequence 40 starts at time T0 in an OUTPUT SIGNAL step 60 in the function generator 22 when the function generator 22 receives a trigger from the test fixture 32 to start the RMS power measurement on the DUT 30. In this step 60, the function generator 22 outputs a stimulus signal to the DUT 30. After the stimulus signal stabilizes at time T1, the sequence 40 proceeds to a PROMPT DMMs step 62 in the function generator 22, wherein the function generator 22 initiates the negotiation of a common reference time by which the DMMs 24, 26 can execute their respective tasks on. In this PROMPT DMMs step 62, the function generator 22 prompts the DMMs 24, 26 to provide their respective desired reference times. The function generator 22 prompts the DMMs 24, 26 by sending a prompting message over the network 28 to the DMMs 24, 26.

The sequence 40 next proceeds to a PROVIDE DESIRED REF TIME step 64 in DMM1 24 and DMM2 26 at times T2 and T4 respectively when the DMMs 24, 26 receive the prompting message from the function generator 22. In this step 64, each of the DMMs 24, 26 responds to the prompting by sending a responding message including a respective desired reference time therein to the function generator 22 and the other DMM 24, 26. In this manner, the DMMs 24, 26 provide each other and the function generator 22 with their respective desired reference times. For DMM1 24, the desired reference time may for example be a time T3 which is given by T2+delta, wherein delta is a predetermined time delay. This predetermined time delay may for example be the time required for a message carrying the desired reference time of DMM1 24 to reach both the function generator 22 and DMM2 26. The desired reference time may alternatively be a later time when DMM1 24 is ready for making a measurement. DMM1 24 may decide in this step what the time T3 should be. Similarly, DMM2 26 will provide its desired reference time T5 to the function generator 22 and DMM1 24. It is shown in FIG. 4 that time T5 is later than time T3. However, time T5 may be exactly the same as or before time T3.

As mentioned above, prompting and providing involve the sending of a message by one device 22, 24, 26 to the other devices 22, 24, 26. Each device 22, 24, 26 may send the message by multicasting the message to the other devices. In this case, the devices 22, 24, 26 belong to a group and share a multicast group address. Each device 22, 24, 26 sends the message only once to the multicast group address. Alternatively, each device 22, 24, 26 may send the message to the other devices 22, 24, 26 by unicasting a message to each of the other devices 22, 24, 26. In this case, the addresses of the other devices 22, 24, 26 are stored in each device 22, 24, 26. The User Datagram Protocol (UDP) is used for sending the message although other protocols can also be used.

After the PROVIDE DESIRED REF TIME step 64 in DMM1 24 and DMM2 26, the sequence 40 next proceeds to a DETERMINE ACTUAL REF TIME step 66 in each of the function generator 22 and the two DMMs 24, 26 when each of the devices 22, 24, 26 determines that all desired reference times from the other devices 22, 24, 26 have been received. Alternatively, each device 22, 24, 26 may have a time window for receiving the desired reference times. If all the desired reference times are not received within this time window, the device 22, 24, 26 may stop the execution of the sequence 40 and flag the occurrence of an error condition. Alternatively, the device 22, 24, 26 may proceed to the DETERMINE ACTUAL REF TIME step 66 regardless of the number of desired reference times received in the time window. In this DETERMINE ACTUAL REF TIME step 66, each device 22, 24, 26 determines the actual reference time independently of the other devices 22, 24, 26. The actual reference time may for example be the latest of all the desired reference times available on the device 22, 24, 26. The available desired reference times include the desired reference time of the device 22, 24, 26 itself and any desired reference times received from the other devices 22, 24, 26. In this embodiment, there are only two desired reference times T4 and T5 from the DMMs 24, 26. The function generator 22 does not have a desired reference time. Consequently, the actual reference time is determined to be time T5 since time T5 is later than time T3. After the actual reference time T5 is determined, the DMMs 24, 26 wait for the arrival of this time T5.

At the actual reference time T5, the sequence 40 ends in an EXECUTE TASK step 68 in each of the two DMMs 24, 26 where there is a respective task for execution. In this step 68, each DMM 24, 26 executes its respective task which involves making a measurement. That is, DMM1 24 measures the voltage and DMM2 26 measures the current at the DUT 30 at time T5. Based on these voltage and current measurements, the power at the DUT 30 for the stimulus signal is then determined. In this embodiment, it is not necessary for the DMMs 24, 26 to know the signal stabilization time in the function generator 22. In other words, the task in each DMM 24, 26 has a relative start time of zero with respect to the actual reference time T5. Both DMM measurements are taken at exactly the same time.

Figure 4:
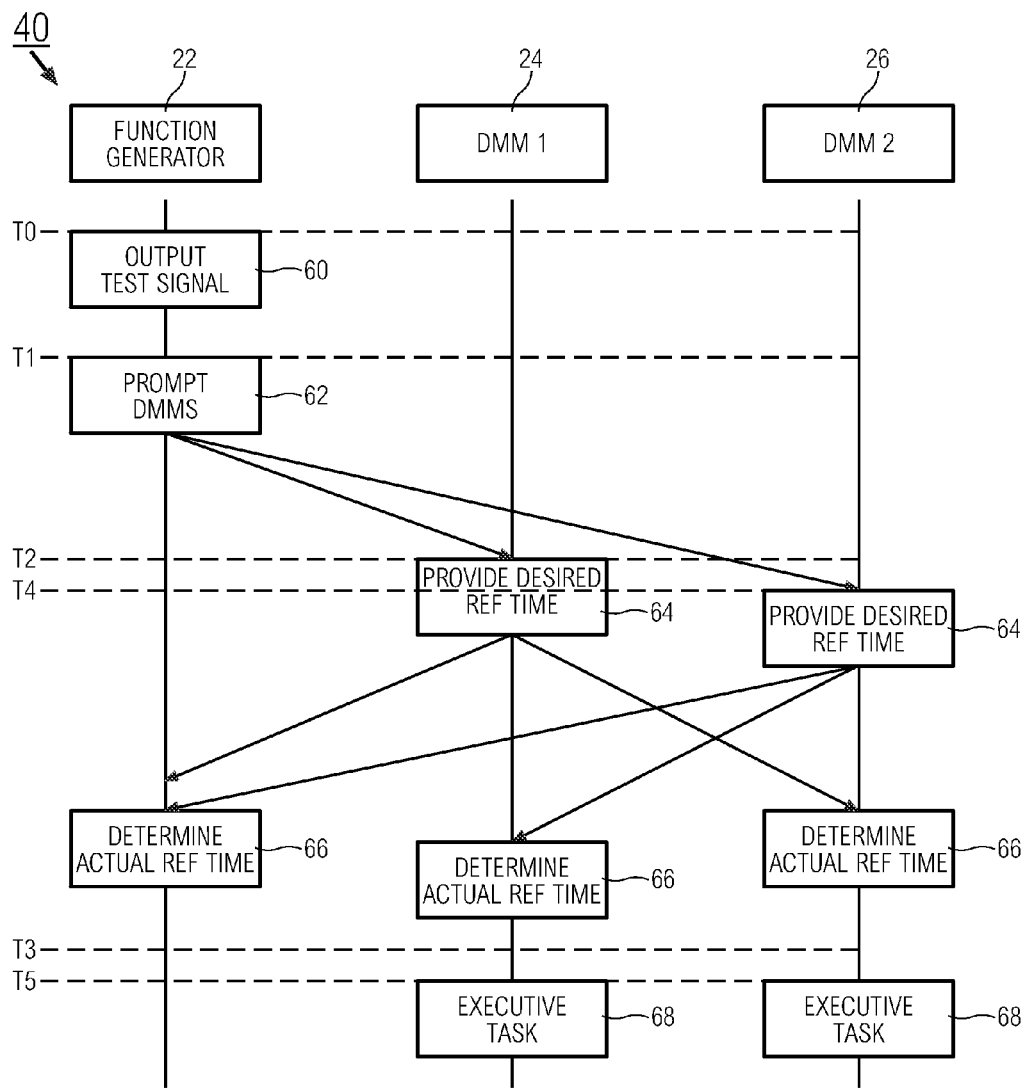
FIG. 4 is a flowchart showing a sequence of steps, according to another embodiment of the invention that is implemented in the test system in FIG. 2 for coordinating between the instruments to make a time-based measurement.
Figure 5:
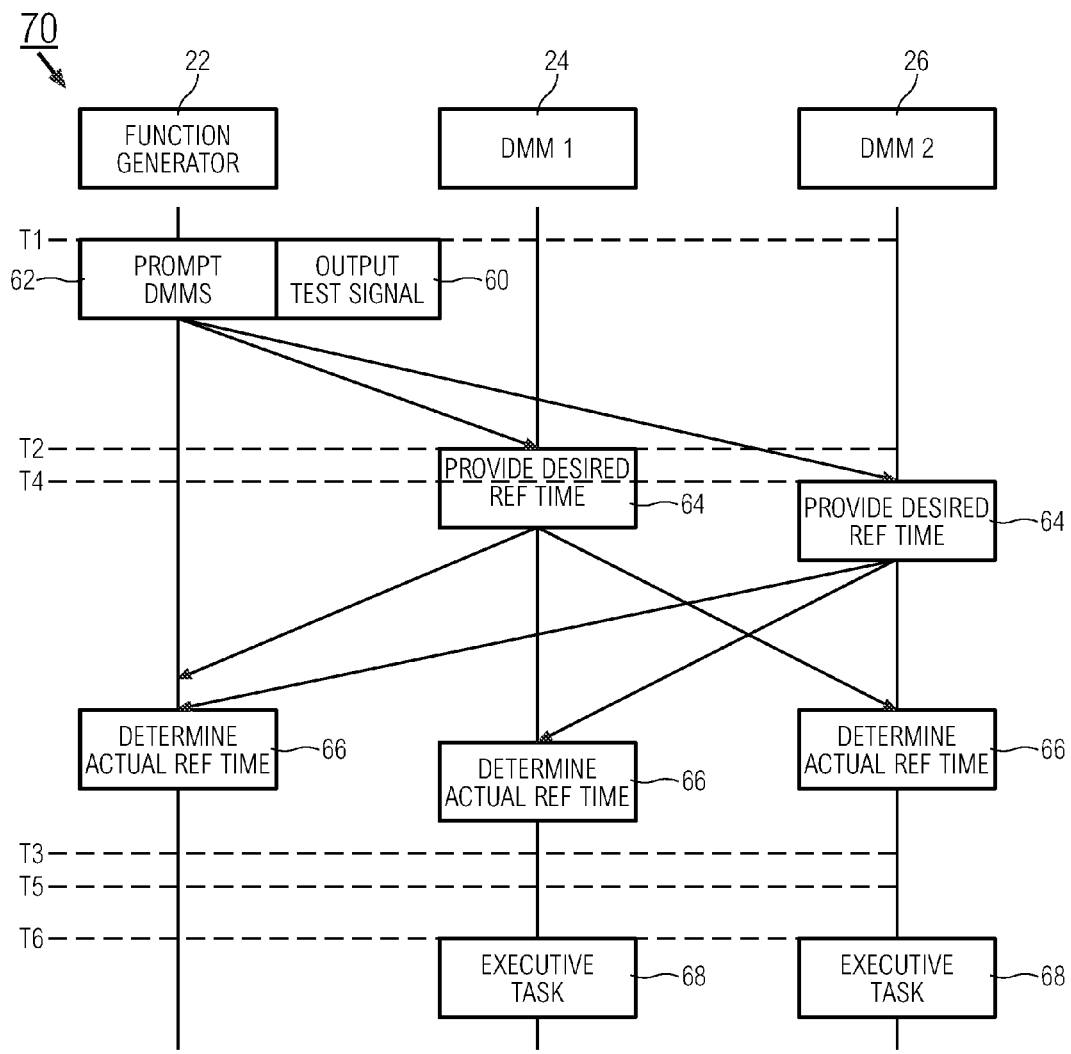
FIG. 5 is a flowchart showing another sequence of steps for carrying out the same measurement as that in FIG. 4.

In the embodiment in FIG. 4, the reference time negotiation session is started by the function generator 22 after the output signal applied to the DUT 30 has stabilized at time T1. FIG. 5 shows a second sequence 70 of steps according to another embodiment of the invention. This second sequence 70 differs from the first sequence 40 in that the function generator 22 carries out the PROMPT DMMS step 62 and the OUTPUT TEST SIGNAL step 60 simultaneously at time T1. Alternatively, the function generator 22 may carry out the PROMPT DMMS step 62 after the OUTPUT TEST SIGNAL step 60 but before the stimulus signal stabilizes at time T6. In FIG. 5, time T6 is shown to be later than the desired reference times T3 and T5 of the DMMs 24, 26. In this second sequence 70, the PROMPT DMMS step 62 in the function generator 22 includes the function generator 22 providing the DMMs 24, 26 with its desired reference time of time T6 at which the stimulus signal would stabilize. This provision of the desired reference time by the function generator 22 may be integral with the prompting wherein a single prompting message sent by the function generator 22 both prompts as well as provide the DMMs 24, 26 with the desired reference time of the function generator 22. The same criterion as that in the first sequence 40 is used in the DETERMINE ACTUAL REF TIME step 66 for obtaining the actual reference time. With time T6 being the latest of all the three desired reference times T3, T5 and T6, time T6 will be selected as the actual reference time in this second sequence 70. At time T6, the DMMs 24, 26 would carry out the respective measurement tasks. Again, each task has a relative start time of zero with respect to the actual reference time T6. With the embodiments in FIGS. 4 and 5, it does not matter how long the stimulus signal from the function generator takes to stabilize. With the reference time negotiation, it is possible to obtain a common reference time by which the DMMs 24, 26 can base the execution of their respective tasks on.

Figure 6:
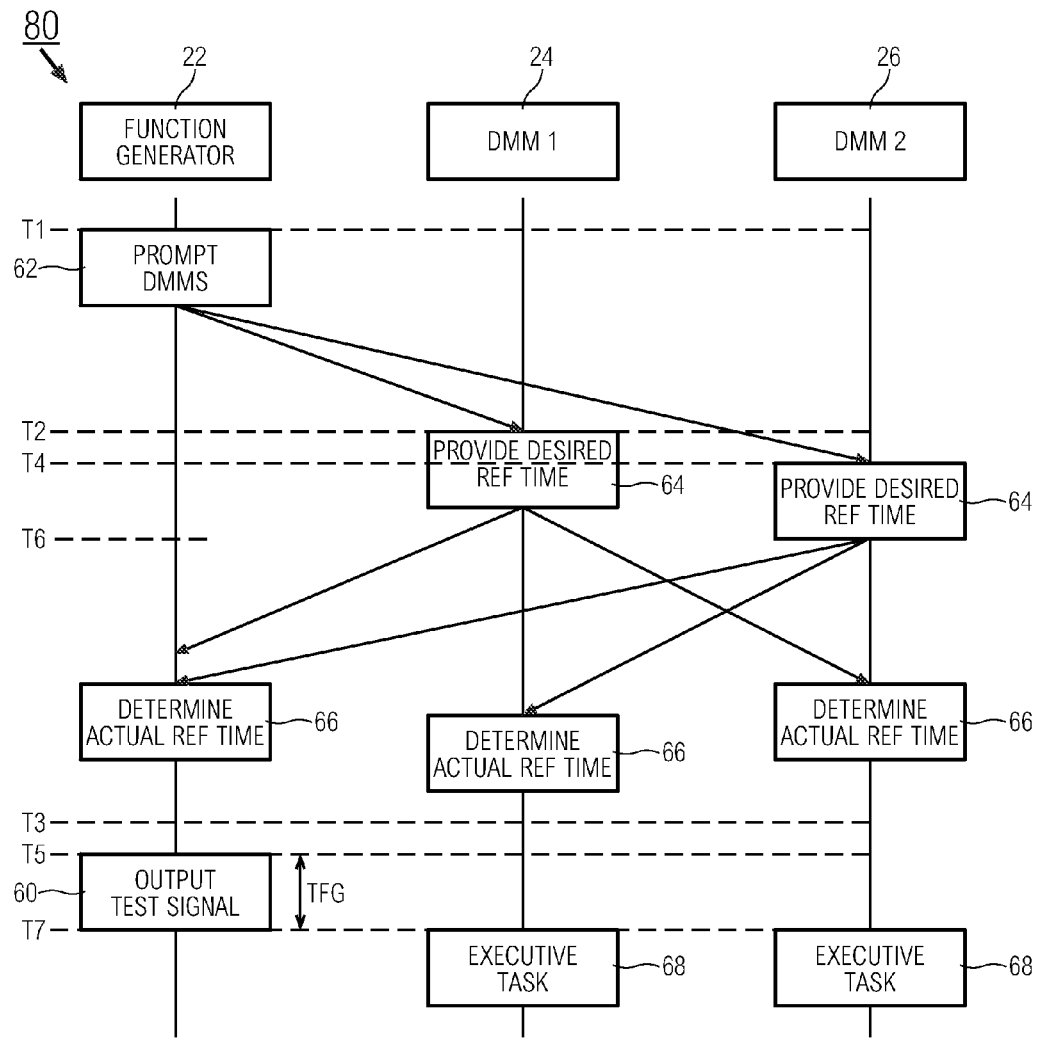
FIG. 6 is a flowchart showing yet another sequence of steps for carrying out the same measurement as that in FIG. 4.

FIG. 6 shows a third sequence 80 wherein the function generator 22 defers outputting the stimulus signal until after the reference time negotiation session is completed. In this embodiment, the function generator 22 when prompting the DMMs 24, 26, also provides the DMMs 24, 26 with the desired reference time of time T6. The desired reference times of the DMMs 24, 26 remain at times T3 and T5 respectively. In this third sequence 80 as shown in FIG. 6, the latest of all the three desired reference times is time T5. Time T5 is thus determined to be the actual reference time by which the devices 22, 24, 26 would base the execution of their respective tasks on. The function generator 22 would time its task of outputting a stimulus signal in the OUTPUT TEST SIGNAL step at precisely time T5, and the DMMs 24, 26 would time their respective measurement tasks to start at a time T7 given by time T5+TFG, wherein TFG is the delay necessary for the stimulus signal of the function generator 22 to stabilize. In other words, the start time of the OUTPUT TEST SIGNAL step 60 is zero and the start time of the EXECUTE TASK step 68 in the DMMs 24, 26 is TFG relative to the actual reference time T5. The TFG delay may be preprogrammed in the DMMs 24, 26. Alternatively, the function generator 22 may provide a TFG delay that is specific to the stimulus signal to the DMMs 24, 26. This TFG delay may be sent in the prompting phase or it may be sent in a separate message to the DMMs 24, 26 prior to time T7.

In the above described sequences 40, 70, 80, each device 22, 24, 26 is thus able to cooperate with at least another device 22, 24, 26 to obtain a reference time the execution of at least one task on one of the devices 22, 24, 26. The initiating device 22 includes a means that prompts the responding device 24, 26 to provide its respective desired reference time. Each responding device 24, 26 includes means that provides the initiating device 22 and any other responding device 24, 26 its desired reference time, in response to the prompting. The responding device 24, 26 also includes means that receives a desired reference time from other responding devices 24, 26; and means that determines an actual reference time from the at least one reference time. These means when implemented in software are stored in the ROM 46 or the non-volatile storage unit 48. Alternatively, these means may be implemented in firmware, hardware (not shown), or a combination thereof.

Although the present invention is described as implemented in the above described embodiments, it is not to be construed to be limited as such. For example, it is described that the function generator 22 and DMMs 24, 26 are LXI compliant devices connected via an Ethernet. This is not necessarily so; the invention may be implemented with devices that can communicate with each other over any network including but not limited to a Controller Area Network (CAN). Furthermore, protocols used by these devices for time synchronization may also include, among others, the Network Time Protocol (NTP).

As another example, in the embodiment in FIG. 4, it should not be construed that the function generator 22 has to always receive the desired reference times from the DMMs 24, 26 and to determine the actual reference time. The function generator 22 may instead simply prompt the DMMs 24, 26 as described above and leave the two DMMs 24, 26 to sort out between the two what the actual reference time should be.

As a further example, it should not be construed that a responding device 24, 26 is one that has a specific task 68 to perform. It is possible that a responding device 24, 26 does not have a task to perform but requires the reference start time to be a time when a specific condition is reached or deemed to have been reached. An example of such a condition includes the ambient temperature being at some value.

As yet a further example, it should not be construed that all responding devices 24, 26 in a multicast group receiving the prompting message from the initiating device 22 are required to respond by providing respective desired reference times. It is possible to have only a subset of the responding devices 24, 26 responding to the prompting message. This subset may be explicitly specified, for example, in the prompting message, in one or more responding messages, other types of messages or a combination thereof. When the responding devices 24, 26 are specified in more than one message, the subset may be a union or an intersection of the responding devices 24, 26 specified in the relevant messages. The subset may be determined each time there is a prompting message, or it may be determined infrequently and remain in effect until changed. Alternatively, this subset of devices 24, 26 may be determined via other means internal to each responding device 24, 26, such as, hardware and/or software means that is able to determine if the responding device 24, 26 belongs to the subset of devices 24, 26 required to respond to the prompting message. These means may do so based on the time the respective responding device 24, 26 receives the prompting message or based on a time specified in the prompting message. The time may be specified as a number, string, etc. in the prompting message. These means within a responding device may also determine if the responding device 24, 26 should respond based on other criteria, such as but not limited to, the state of the responding device 24, 26 and data that was obtained in a variety of ways.

As yet another example, it is not necessary for the devices 22, 24, 26 to send their desired reference times to each other for them to individually determine an actual reference time. The devices 22, 24, 26 may send their respective desired reference times to a single device 22, 24, 26 in the network. The single device 22, 24, 26 may then determine the actual reference time based on the desired reference times as described, and multicast or unicast this actual reference time to the devices 22, 24, 26 involved.

As yet a further example, each message may be tagged with a session identity (ID) to indicate a reference time negotiation session to which the message belongs. With this session ID, each device 22, 24, 26 is able to participate in more than one reference time negotiation sessions simultaneously.

What is claimed is:

1. A method of determining, between an initiating device and at least one responding device, a reference time for execution of a task thereon, the method comprising:
   prompting a plurality of devices by the initiating device to provide a respective desired reference time;
   providing, in response to the prompting, a respective desired reference time by a subset of the plurality of responding devices; and
   determining an actual reference time based on any desired reference times provided, wherein prompting of a plurality of responding devices comprises the initiating device sending a prompting message to the plurality of responding devices, and providing a respective desired reference time by a subset of the plurality of responding devices comprises each of the subset of the plurality of responding devices sending a responding message including the respective desired reference time, the subset of responding devices comprising one of at least one responding device specified in at least one of the prompting message and a responding message; and at least one responding device determining that it is included in the subset based on one of the time the responding device receives the prompting message and a time specified in the prompting message.

2. A method according to claim 1, wherein providing a respective desired reference time by each responding device comprises the responding device providing the at least one other device its desired reference time, and wherein determining an actual reference time comprises each device having at least one desired reference time thereon determining an actual reference time based on the at least one desired reference time thereon.

3. A method according to claim 2, wherein the initiating and responding devices comprise at least two devices connected to a communication network, and wherein providing the at least one other device with a desired reference time comprises sending a message over the network to the at least one other device.

4. A method according to claim 3, wherein sending the message comprises one of multicasting and unicasting the message.

5. A method according to claim 3, wherein each message comprises a message including a reference time negotiation session identity (ID).

6. A method according to claim 3, wherein at least one message comprises a message including a device specific time delay.

7. A method according to claim 1, wherein prompting by the initiating device comprises providing a desired reference time by the initiating device to the at least one responding device.

8. A method according to claim 1, wherein the desired reference time of a responding device comprises a time obtained by adding a time delay to a time the responding device receives the prompting.

9. A method according to claim 8, wherein the time delay comprises the time required for a device to send a message to another device.

10. A method according to claim 1, wherein the actual reference time comprises the latest of all the desired reference times.

11. A device that cooperates with at least another device to obtain a reference time for execution of at least one task on one of the devices, the device comprising:
   means that provides a respective desired reference time;
   means that receives a respective desired reference time from each of the at least another device; and
   means that determines an actual reference time based on its desired reference time and any desired reference times received.

12. A device according to claim 11, wherein the actual reference time comprises the latest of all the desired reference times received.

13. A device according to claim 11, wherein the devices are networked devices and wherein means that provides a respective desired reference time and means that receives a respective desired reference time comprise means that sends a message including the respective desired reference time of the device and means that receives a message from each of the at least another device including the desired reference time of the device respectively.

14. A device according to claim 13, wherein the means that sends a message comprises one of means that multicasts the message and means that unicasts the message.

15. A device according to claim 13, wherein each message comprises a message including a reference time negotiation session identity (ID).

16. A system comprising an initiating device cooperating with at least one responding device to obtain a reference time for the execution of at least one task on one of the devices, wherein the initiating device comprises:
   means that prompts the responding device to provide its respective desired reference time; and
   the responding device comprises:

means that provides the initiating device and any other responding device its desired reference time, in response to the prompting;

means that receives a respective desired reference time from other responding devices; and means that determines an actual reference time from any desired reference start times received.

17. A system according to claim 16, wherein the initiating device further comprises:

means that provides the responding device with its desired reference time;

means that receives a respective desired reference time from the responding device; and means that determines an actual reference time from any desired reference start times available thereon.

18. A system according to claim 16, wherein the actual reference time comprises the latest of all the desired reference times received.

* * * * *